(12) United States Patent
Zhang et al.

(10) Patent No.: US 10,368,450 B2
(45) Date of Patent: Jul. 30, 2019

(54) HOUSING ASSEMBLY FOR ELECTRONIC DEVICE AND ELECTRONIC DEVICE

(71) Applicant: GUANGDONG OPPO MOBILE TELECOMMUNiCATIONS CORP., LTD., Dongguan, Guangdong (CN)

(72) Inventors: Hui Zhang, Dongguan (CN); Wenzhen Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/853,471

(22) Filed: Dec. 22, 2017

(65) Prior Publication Data

US 2018/0255652 A1 Sep. 6, 2018

(30) Foreign Application Priority Data

Mar. 1, 2017 (CN) .......................... 2017 1 0117760
Mar. 1, 2017 (CN) ..................... 2017 2 0195783 U

(51) Int. Cl.
*H05K 5/00* (2006.01)
*H05K 7/00* (2006.01)
(Continued)

(52) U.S. Cl.
CPC ......... *H05K 5/0004* (2013.01); *G06F 1/1613* (2013.01); *H01M 2/1022* (2013.01);
(Continued)

(58) Field of Classification Search
CPC ........................................................ G06F 1/16
See application file for complete search history.

(56) References Cited

U.S. PATENT DOCUMENTS

| | | | |
|---|---|---|---|
| 2011/0164365 A1* | 7/2011 | McClure | G06F 1/1613 361/679.3 |
| 2012/0163645 A1 | 6/2012 | Hwang et al. | |
| 2013/0114840 A1 | 5/2013 | Shin | |

FOREIGN PATENT DOCUMENTS

CN 102256455 A 11/2011
CN 203942555 U 11/2014
(Continued)

OTHER PUBLICATIONS

European Patent Application No. 17207025.2, Extended Search and Opinion dated Jun. 29, 2018, 8 pages.
(Continued)

*Primary Examiner* — Jerry Wu
(74) *Attorney, Agent, or Firm* — Lathrop Gage LLP

(57) ABSTRACT

The present disclosure provides a housing assembly for an electronic device and an electronic device. The housing assembly includes a first housing, a second housing and a reinforcing column. The second housing and the first housing collectively define a receptacle, and at least a part of the reinforcing column is embedded in at least one of the first housing and the second housing. For the housing assembly according to the present disclosure, by embedding the reinforcing column in at least one of the first housing and the second housing, structural strength of the first housing or the second housing can be enhanced, and hence overall structural strength of the housing assembly can be enhanced, thereby improving bending resistance of the housing assembly and facilitating a lightweight and thin design of the electronic device.

14 Claims, 3 Drawing Sheets

(51) Int. Cl.
- *H04M 1/18* (2006.01)
- *G06F 1/16* (2006.01)
- *H01M 2/10* (2006.01)
- *H04M 1/02* (2006.01)

(52) U.S. Cl.
CPC ......... *H04M 1/0249* (2013.01); *H04M 1/185* (2013.01); *H04M 1/0262* (2013.01)

(56) References Cited

FOREIGN PATENT DOCUMENTS

| | | |
|---|---|---|
| CN | 105658007 A | 6/2016 |
| CN | 106852048 A | 6/2017 |
| CN | 206452632 U | 8/2017 |
| EP | 2388980 A2 | 11/2011 |
| KR | 100810375 B1 | 3/2008 |
| TW | 201341196 A | 10/2013 |
| WO | WO 2016039803 A1 | 3/2016 |

OTHER PUBLICATIONS

Taiwan Patent Application No. 107100871, Office Action dated Aug. 21, 2018, 4 pages.

PCT/CN2017/116231 International Search Report and Written Opinion dated Mar. 22, 2018, 11 pages.

\* cited by examiner

HOUSING ASSEMBLY FOR ELECTRONIC DEVICE AND ELECTRONIC DEVICE

CROSS-REFERENCE TO RELATED APPLICATION

This application claims priority to and benefits of Chinese Patent Application No. 201710117760.4, filed with State Intellectual Property Office on Mar. 1, 2017, and Chinese Patent Application No. 201720195783.2, filed with State Intellectual Property Office on Mar. 1, 2017, the entire content of which is incorporated herein by reference.

FIELD

The present disclosure relates to a technical field of communication equipment, and more particularly, to a housing assembly for an electronic device and an electronic device.

BACKGROUND

With the development of science and technology, intelligent electronic devices (such as smart phones) tend to become lightweight and thin. When intelligent electronic devices are thinned to a certain extent, the overall strength will be weakened, which easily leads to a bending phenomenon of intelligent electronic devices, thereby damaging a battery easily and even causing fire in severe cases.

SUMMARY

The present disclosure aims to solve at least one of the problems existing in the related art. Accordingly, the present disclosure provides a housing assembly for an electronic device.

The housing assembly for the electronic device according to embodiments of the present disclosure includes: a first housing; a second housing, the second housing and the first housing collectively defining a receptacle capable of receiving a battery; and two reinforcing features spaced apart from each other, each of the two reinforcing features having at least a part embedded in at least one of the first housing and the second housing, and axes of the two reinforcing features being flush with a central axis of the receptacle.

The present disclosure further provides an electronic device includes a housing assembly a battery and a display unit. The housing assembly includes a battery cover, a front cover and two reinforcing columns, the two reinforcing columns being arranged at two sides of the battery, axes of the two reinforcing columns are flush with a central axis of the battery, and the display unit being embedded in the housing assembly.

The present disclosure further provides another housing assembly for an electronic device. The housing assembly defines a receptacle and includes two reinforcing columns, at least a part of each of the two reinforcing columns being embedded in the housing assembly and close to the receptacle, and axes of the two reinforcing columns being flush with a central axis of the receptacle.

BRIEF DESCRIPTION OF THE DRAWINGS

These and additional aspects and advantages of embodiments of the present disclosure will become apparent and more readily appreciated from the following descriptions made with reference to the drawings, in which.

Figure 1:
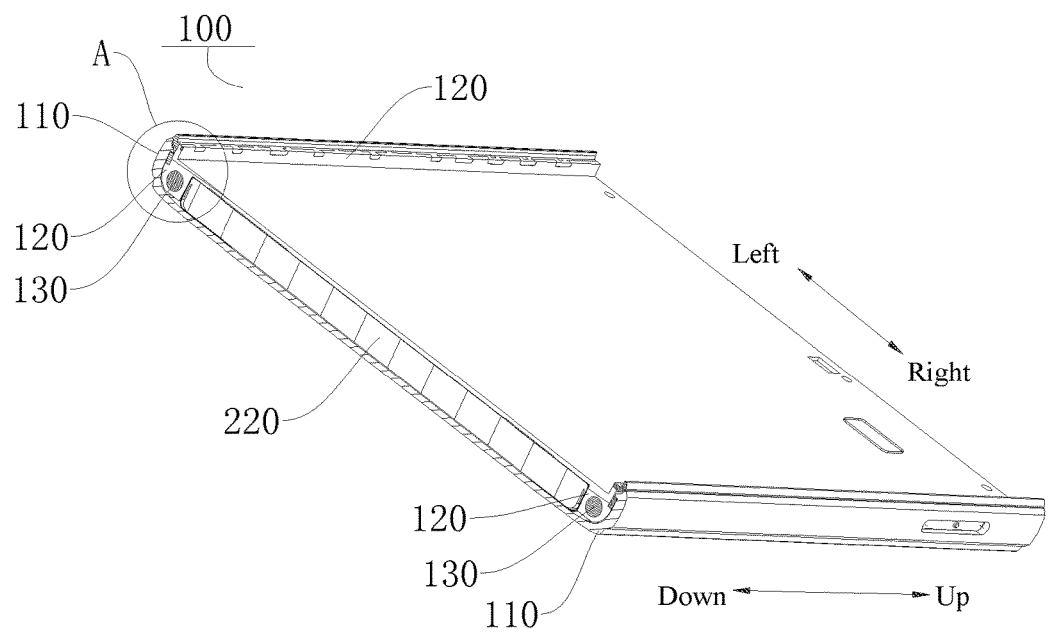
FIG. 1 illustrates a schematic view of a housing assembly for an electronic device according to an embodiment of the present disclosure.

REFERENCE NUMERALS housing assembly 100,
first housing 110, receptacle 111,
second housing 120,
reinforcing column 130,
electronic device 200, display unit 210, battery 220.

DETAILED DESCRIPTION

Embodiments of the present disclosure will be described in detail and examples of the embodiments will be illustrated in the accompanying drawing. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

In the specification, it is to be understood that terms such as "length," "width," "upper," "lower," "front," "rear," "left," "right," "vertical," "horizontal," "top," "bottom," "inner" and "outer" should be construed to refer to the orientation as then described or as illustrated in the drawings under discussion. These relative terms are for convenience of description and do not require that the present disclosure be constructed or operated in a particular orientation, and hence cannot be constructed to limit the present disclosure. In addition, the feature defined with "first" and "second" may indicate or imply including one or more of this feature. In the description of the present disclosure, the term "a plurality of" means two or more than two, unless specified otherwise.

In the present disclosure, unless specified or limited otherwise, the terms "mounted," "connected," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

A housing assembly 100 for an electronic device and an electronic device 200 per se according to embodiments of the present disclosure will be described with reference to FIGS. 1 to 4.

FIG. 1 illustrates the housing assembly 100 according to embodiments of the present disclosure, and the housing assembly 100 includes: a first housing 110, a second housing 120 and a reinforcing feature, such as a reinforcing column 130.

Figure 2:
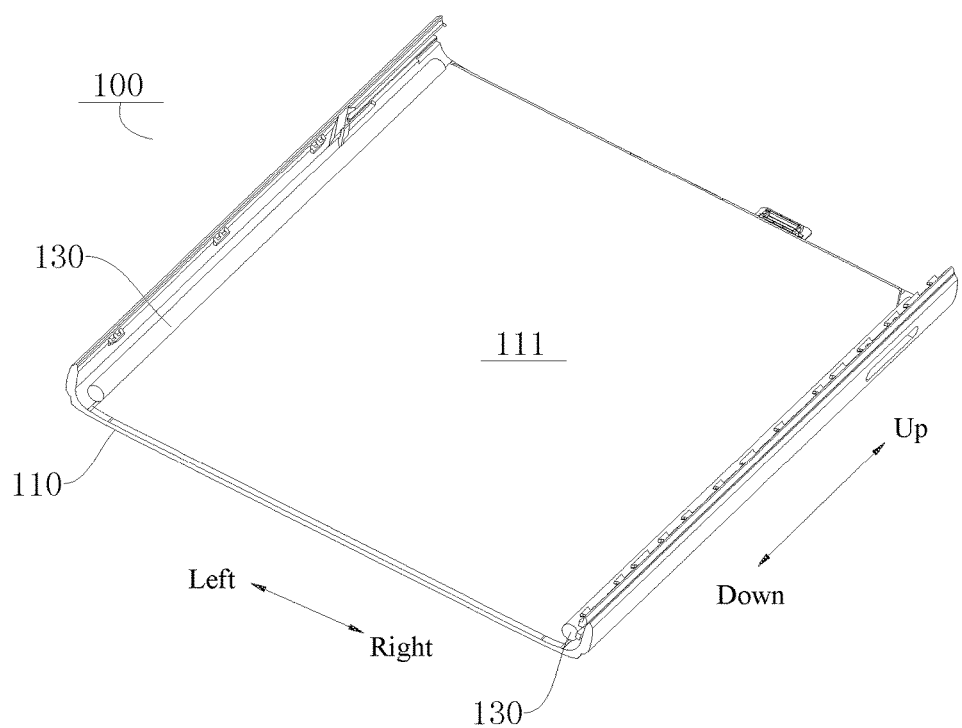
FIG. 2 illustrates a partial view of a housing assembly for an electronic device according to an embodiment of the present disclosure.
Figure 3:
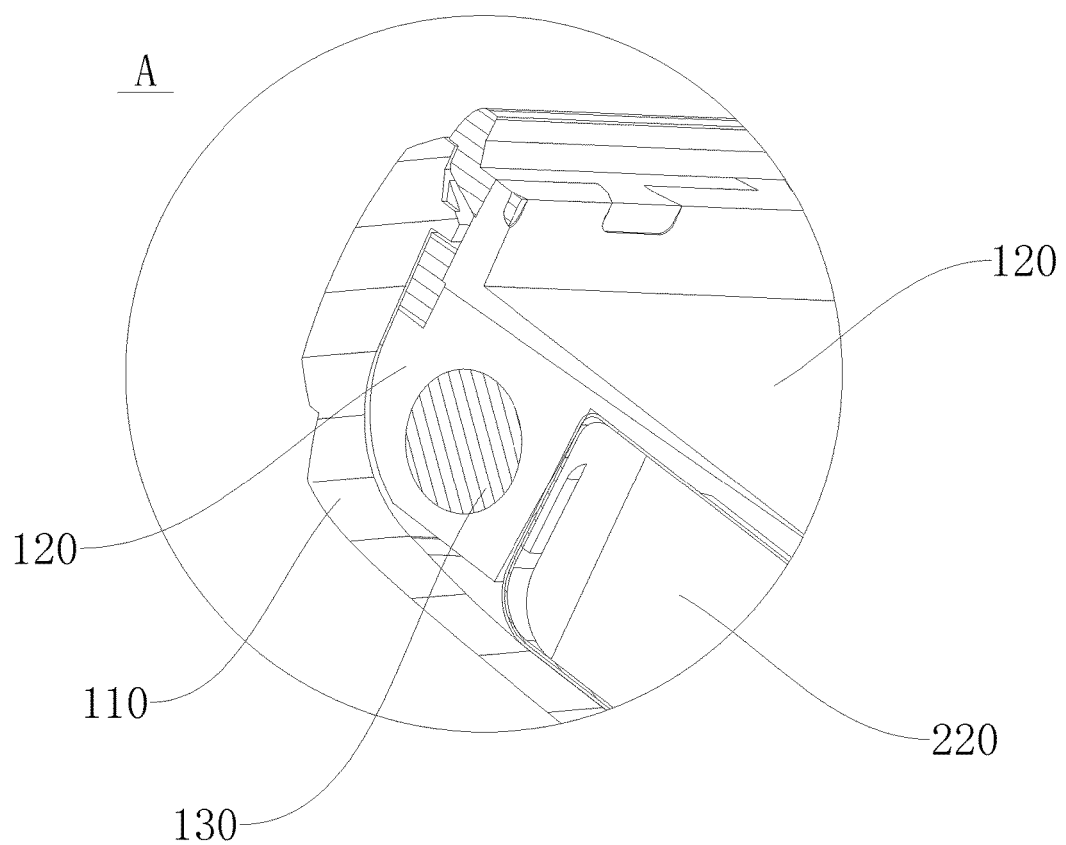
FIG. 3 is a partially enlarged view of part A circled in FIG. 1.

Specifically, as illustrated in FIGS. 1 and 2, the first housing 110 and the second housing 120 define a receptacle 111, a mainboard circuit, a battery 220 and other components of the electronic device can be arranged in the receptacle 111. As illustrated in FIGS. 1 and 3, at least a part of the reinforcing column 130 is embedded in at least one of the first housing 110 and the second housing 120. That is, the reinforcing column 130 can be completely embedded in the housing assembly 100, or can be partially embedded in the housing assembly 100 and partially exposed outside the housing assembly 100. At least a part of the reinforcing column 130 can be embedded in the first housing 110, and the reinforcing column 130 can also be embedded in the second housing 120. Certainly, the reinforcing column 130 can be embedded in both the first housing 110 and the second housing 120.

It should be noted that the housing assembly 100 has poor structural strength at a location of the receptacle 111. By providing at least one of the first housing 110 and the second housing 120 with the reinforcing column 130, structural strength of the first housing 110 or structural strength of the second housing 120 can be enhanced, thereby promoting the structural strength of the housing assembly 100 and facilitating a lightweight design of the electronic device.

In the housing assembly 100 for the electronic device according to embodiments of the present disclosure, by embedding the reinforcing column 130 in at least one of the first housing 110 and the second housing 120, the structural strength of the first housing 110 or the structural strength of the second housing 120 can be enhanced, thereby promoting the overall structural strength of the housing assembly 100, reinforcing bending resistance of the housing assembly 100, and facilitating the lightweight design of the electronic device.

According to an embodiment, in order to arrange the reinforcing column 130 conveniently and optimize a spatial layout in the receptacle 111, the reinforcing column 130 can extend along a length direction or a width direction of the receptacle 111. That is, the reinforcing column 130 can extend along the length direction (e.g. an up-down direction in FIG. 2) of the receptacle 111, and the reinforcing column 130 can also extend along the width direction (e.g. a left-right direction in FIG. 2) of the receptacle 111.

For example, FIG. 2 illustrates that the reinforcing column 130 extends along the length direction of the receptacle 111 (e.g. the up-down direction in FIG. 2), such that the overall structural strength of the housing assembly 100 can be improved, and the bending resistance of the housing assembly 100 can be enhanced. In an example of the present disclosure, a plurality of spaced reinforcing columns 130 can be provided, so as to further improve the bending resistance of the housing assembly 100.

For instance, in an example illustrated in FIG. 2, two reinforcing columns 130 can be provided, one reinforcing column 130 is close to a first end of the receptacle 111, and the other reinforcing column 130 is close to a second end of the receptacle 111. In other words, two reinforcing columns 130 extend along the length direction (e.g. the up-down direction in FIG. 2) of the receptacle 111, one reinforcing column 130 is located at a left side of the receptacle 111, and the other reinforcing column 130 is located at a right side of the receptacle 111. That is one reinforcing column 130 is located at a left side wall of the housing assembly 100 while the other reinforcing column 130 is located at a right side wall of the housing assembly 100.

In an example of the present disclosure, as illustrated in FIG. 3, a contour line of a cross section of the reinforcing column 130 can be a circle, so as to embed the reinforcing column 130 in the first housing 110 or the second housing 120 conveniently, meanwhile enhance structural strength of the reinforcing column 130 and improve the bending resistance of the housing assembly 100. It should be noted that the shape of the contour line of the cross section of the reinforcing column 130 is not limited thereto. For instance, in another example of the present disclosure, the contour line of the cross section of the reinforcing column 130 can be a polygon, such as a triangle, a quadrangle or a hexagon, so as to promote connection strength and connection stability between the reinforcing column 130 and the first housing 110 or the second housing 120. That is the reinforcing column can have a circular or polygonal cross section.

According to an example of the present disclosure, the first housing 110 or the second housing 120 embedded with the reinforcing column 130 can be an injection molded part. It could be understood that, when the reinforcing column 130 is embedded in the first housing 110, the first housing 110 can be an injection molded part. During injection molding of the first housing 110, the reinforcing column 130 can be placed in an injection mold for the first housing 110, so as to embed the reinforcing column 130 in the first housing 110 at the same time of injection molding of the first housing 110. Similarly, when the reinforcing column 130 is embedded in the second housing 120, the second housing 120 can be an injection molded part. During injection molding of the second housing 120, the reinforcing column 130 can be placed in an injection mold for the second housing 120, so as to embed the reinforcing column 130 in the second housing 120 at the same time of injection molding of the second housing 120. Therefore, an assembly process for the reinforcing column 130 and the first housing 110 or the second housing 120 can be simplified, thereby shortening a production cycle and saving production costs.

In an example of the present disclosure, the first housing 110 or the second housing 120 can be an aluminum-magnesium alloy piece or an aluminum alloy piece, so as to enhance the structural strength of the housing assembly 100. In order to further improve the structural strength of the housing assembly 100, in an example of the present disclosure, the reinforcing column 130 can be a stainless steel piece.

It should be noted that materials of the first housing 110, the second housing 120 and the reinforcing column 130 are not limited thereto, as long as the structural strength of the housing assembly 100 can be improved. For instance, in another example of the present disclosure, hardness of the reinforcing column 130 is greater than hardness of the first housing 110 or the second housing 120. In other words, when the first housing 110 is embedded with the reinforcing column 130, the hardness of the reinforcing column 130 is greater than the hardness of the first housing 110. When the second housing 120 is embedded with the reinforcing column 130, the hardness of the reinforcing column 130 is greater than the hardness of the second housing 120.

Figure 4:
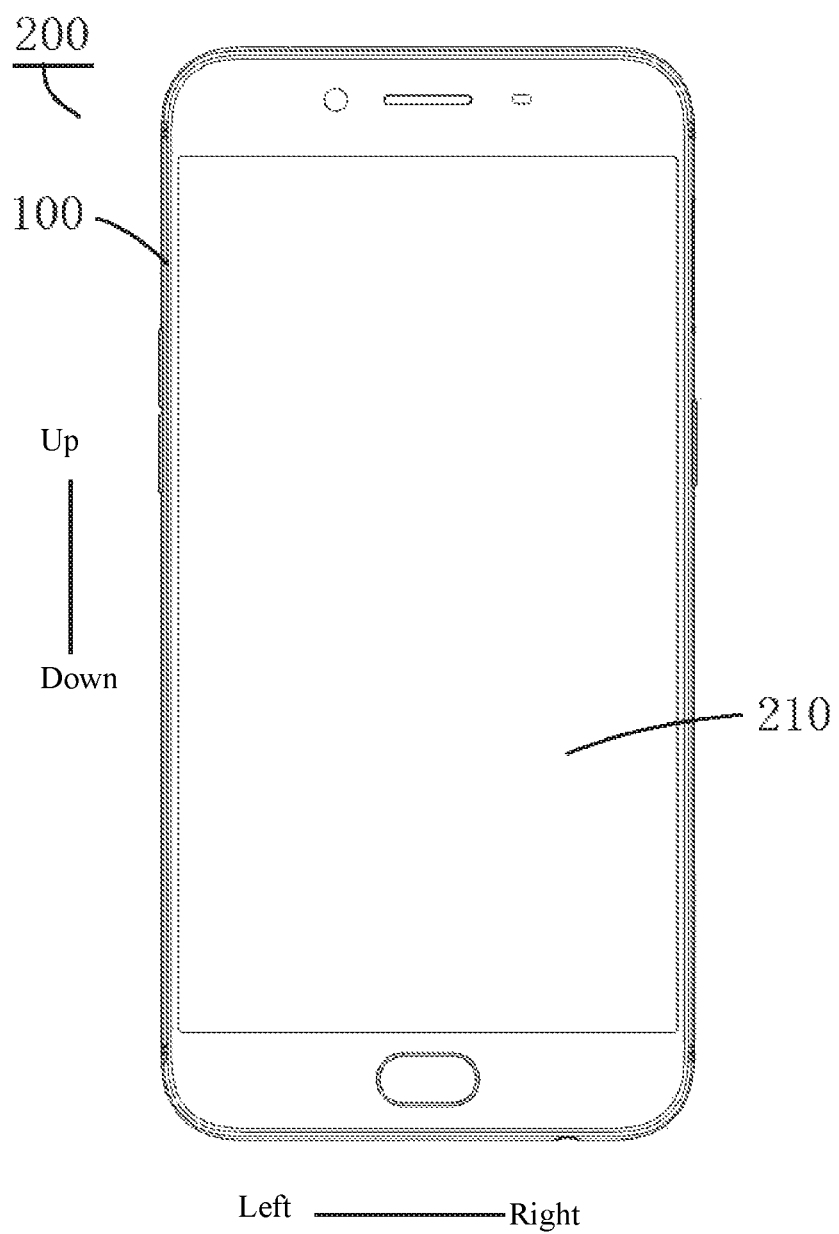
FIG. 4 illustrates a schematic view of an electronic device according to an embodiment of the present disclosure.

FIG. 4 illustrates an electronic device 200 according to embodiments of the present disclosure, and the electronic device 200 includes the above housing assembly 100.

In the electronic device 200 according to embodiments of the present disclosure, by embedding the reinforcing column 130 in at least one of the first housing 110 and the second housing 120, the structural strength of the first housing 110 or the second housing 120 can be enhanced, thereby promoting the overall structural strength of the housing assembly 100, improving the bending resistance of the housing assembly 100, and facilitating the lightweight design of the electronic device 200.

The electronic device 200 according to embodiments of the present disclosure includes the housing assembly 100 illustrated in FIGS. 1 to 3, the housing assembly 100 has the receptacle 111 and the reinforcing column 130, and at least a part of the reinforcing column 130 is embedded in the housing assembly 100 and is close to the receptacle 111. That is, the reinforcing column 130 can be completely embedded in the housing assembly 100, or can be partially embedded in the housing assembly 100 and partially exposed outside the housing assembly 100. It should be noted that "the housing assembly" herein can include one component or can refer to a part composed of a plurality of components; "the receptacle" herein can refer to a space area defined by one component or refer to a space area defined by a plurality of components.

Additionally, the housing assembly 100 has poor structural strength at the location of the receptacle 111. By providing the housing assembly 100 with the reinforcing column 130, the structural strength of the housing assembly 100 can be enhanced, thereby facilitating the lightweight design of the electronic device 200.

In the housing assembly 100 for the electronic device 200 according to embodiments of the present disclosure, by embedding the reinforcing column 130 in the housing assembly 100, the overall structural strength of the housing assembly 100 can be enhanced, thereby improving the bending resistance of the housing assembly 100, and facilitating the lightweight design of the electronic device 200.

The electronic device 200 according to embodiments of the present disclosure will be described in detail with reference to FIGS. 1 to 4. It should be noted that "the electronic device" used herein can be a terminal, a communication terminal or a terminal device, including but not limited to a device configured to be connected via a wired connection (such as a public switched telephone network (PSTN), a digital subscriber line (DSL), a digital cable, a direct cable connection, and/or another data connection/network) and/or receive/transmit a communication signal via a wireless interface (e.g., for a cellular network, a wireless local area network (WLAN), a digital television network such as a DVB-H network, a satellite network, an AM-FM broadcast transmitter, and/or another communication terminal). The communication terminal configured to communicate via the wireless interface can be referred to as "a wireless communication terminal," "a wireless terminal" and/or "a mobile terminal." Examples of the mobile terminal include but are not limited to a satellite or cellular telephone; a personal communication system (PCS) terminal capable of combining cellular radiotelephone with data processing, facsimile and data communication capabilities; a PDA integrated with a radiotelephone, a pager, an Internet/Intranet access, a Web browser, a notebook, a calendar, and/or a global positioning system (GPS) receiver; and conventional laptop and/or palmtop receivers or other electronic devices including radiotelephone transceivers.

The electronic device 200 can be a device capable of acquiring data from the outside and processing the data, or the electronic device 200 can be a device including a built-in battery 220 and capable of charging the battery 220 by drawing current from the outside, for example, a mobile phone, a tablet computer, a computing device or an information display device.

The electronic device 200 to which the present disclosure is applicable will be introduced by example of the mobile phone. It is worth understanding that the following description is only explanatory and is not intended to limit the present disclosure particularly.

In embodiments of the present disclosure, the mobile phone can include the housing assembly 100, a display unit 210, a radio-frequency circuit, a memory, an input unit, a wireless fidelity (Wi-Fi) module, a sensor, an audio-frequency circuit, a processor, a projecting unit, a photographing unit, the battery 220 and the like.

As illustrated in FIGS. 1 to 3, the housing assembly 100 includes the first housing 110, the second housing 120 and two reinforcing columns 130. The first housing 110 can serve as a rear cover (or called a battery cover) of the mobile phone, and the second housing 120 can be a front cover of the mobile phone. The first housing 110 and the second housing 120 define the receptacle 111, and the radio-frequency circuit, the memory, the input unit, the Wi-Fi module, the sensor, the audio-frequency circuit, the processor, the projecting unit, the photographing unit, the battery 220 and the like can be arranged in the receptacle 111. As illustrated in FIG. 4, the display unit 210 can be embedded in a front face of the housing assembly 100.

As illustrated in FIGS. 1 and 3, the reinforcing column 130 is embedded in the second housing 120. The reinforcing column 130 extends along the length direction (e.g. the up-down direction in FIG. 2) of the receptacle 111. The two reinforcing columns 130 each extend along the length direction (e.g. the up-down direction in FIG. 2) of the receptacle 111, one reinforcing column 130 is located at the left side of the receptacle 111, and the other reinforcing column 130 is located at the right side of the receptacle 111. That is one reinforcing column 130 is located at the left side wall of the housing assembly 100 while the other reinforcing column 130 is located at the right side wall of the housing assembly 100. The two reinforcing columns are arranged at two sides of the battery, and axes of the two reinforcing columns are flush with a central axis of the battery. Thus, the overall structural strength of the housing assembly 100 can be improved, and the bending resistance of the housing assembly 100 can be enhanced.

As illustrated in FIG. 3, the contour line of the cross section of the reinforcing column 130 can be circular, so as to embed the reinforcing column 130 in the first housing 110 or the second housing 120 conveniently, meanwhile enhance the structural strength of the reinforcing column 130 and improve the bending resistance of the housing assembly 100. The second housing 120 can be the injection molded part, and during the injection molding of the second housing 120, the reinforcing column 130 can be placed in the injection mold for the second housing 120, so as to embed the reinforcing column 130 in the second housing 120 at the same time of injection molding of the second housing 120. Further, the hardness of the reinforcing column 130 is greater than the hardness of the first housing 110 or the second housing 120.

The radio-frequency (RF) circuit can be used to receive and transmit a signal during information transmission and reception or during a call. Especially, when downlink information from a base station is received, the RF circuit sends the downlink information to the processor for processing, and additionally sends uplink data from the mobile phone to the base station. Usually, the RF circuit includes but is not limited to an antenna, at least one amplifier, a transceiver, a coupler, a low noise amplifier, a duplexer and etc. In addition, the RF circuit can communicate with the network and other devices via wireless communication. The wireless communication can employ any communication standard or protocol, including but not limited to global system for mobile communication (GSM), general packet radio service (GPRS), code division multiple access (CDMA), wideband code division multiple access (WCDMA), long term evolution (LTE), e-mail and short messaging service (SMS).

The memory can be used to store software programs and modules, and the processor runs various software applications in the mobile phone and performs data processing by running the software programs and modules stored in the memory. The memory can mainly include a program storage area and a data storage area. The program storage area can store an operating system, at least one application program required for a function (such as a voice playback function, an image playback function and etc.); the data storage area can store data (such as audio data, contacts and etc.) created according to the use of the mobile phone. In addition, the memory can include a high-speed random access memory, and can also include a non-volatile memory, such as at least one disk storage device and flash memory device, or include other volatile solid state memory devices.

The input unit can be configured to receive incoming numbers or character information, and generate a key signal related to user settings and function control of the mobile phone. Specifically, the input unit can include a touch panel and other input devices. The touch panel, also known as a touch screen, can collect a touch operation made by a user on or near the touch panel (for example, an operation made by the user on the touch panel or near the touch panel by means of a finger, a touch pen or any other suitable object or accessory), and drive the corresponding connection device according to a preset program. Optionally, the touch panel can include a touch detection device and a touch controller. The touch detection device is configured to detect a touch orientation of the user, detect a signal from the touch operation, and transmit the signal to the touch controller. The touch controller is configured to receive the touch signal from the touch detection device, convert it into contact coordinates and send the contact coordinates to the processor and can be configured to receive and execute a command from the processor. In addition, it is possible to touch the panel in resistive type, capacitive type, infrared type, face acoustic wave and other types. The input unit can include other input devices apart from the touch panel. Specifically, other input devices can include, but are not limited to one or more of a physical keypad, a function key (e.g. a volume control button, a power button, etc.), a trackball, a mouse and an operating rod.

The display unit 210 is configured to display information input by or presented to the user, and various menus of the mobile phone. The display unit 210 can include a display panel, and optionally, the display panel can be configured in forms of a liquid crystal display (LCD), an organic light-emitting diode (OLED) and the like. Further, the touch panel can overlay the display panel; when the touch panel detects a touch operation on or near it, the touch operation is sent to the processor to determine which type the touch event belongs to, and then the processor provides corresponding visual output on the display panel according to the type of the touch event.

The location, which can be recognized by the user's eye in the display panel, besides the visual output, can serve as a "display area" described later. The touch panel and the display panel can be two separate components to achieve input and output functions of the mobile phone, or can be integrated to achieve the input and output functions of the mobile phone.

In addition, the mobile phone can also include at least one sensor, such as an attitude sensor, a light sensor and other sensors.

Specifically, the attitude sensor can also be referred as a motion sensor, and as one of the motion sensors, a gravity sensor can be employed. As for the gravity sensor, a cantilever displacement device is made of an elastic-sensitive element, and an electrical contact is driven by an energy-storage spring made of the elastic-sensitive element, so as to achieve the conversion of gravity changes into electrical signal changes.

As an alternative motion sensor, an accelerometer sensor can be used. The accelerometer sensor can detect the magnitude of acceleration in all directions (generally in three axes), and detect the magnitude and direction of the gravity at rest, and can be used for attitude identification of the mobile phone (such as horizontal and vertical screen switch, related games, magnetometer attitude calibration), and vibration-recognition related functions (such as pedometer and percussion).

In this mobile phone, the motion sensors listed above can be used as an element for obtaining an "attitude parameter" described later, which is not limited thereto, however. Other sensors capable of obtaining the "attitude parameter" fall into the protection scope of the present disclosure, for example, a gyroscope. The working principle and data processing of the gyroscope can be similar to the related art, so the detailed description thereof will be omitted to avoid redundancy.

In addition, in the embodiments of the present disclosure, a barometer, a hygrometer, thermometer, an infrared sensor and the like can be used as a sensor, which is not described in detail.

The light sensor can include an ambient light sensor and a proximity sensor, in which the ambient light sensor can adjust brightness of the display panel in accordance with the ambient light, and the proximity sensor can turn off the display panel and/or backlight when the mobile phone is moved to the ear.

The audio circuit, a loudspeaker and a microphone can provide an audio interface between the user and the mobile phone. The audio circuit can transmit an electrical signal converted from the received audio data to the loudspeaker, and the loudspeaker converts the electrical signal into an audio signal to be output. On the other hand, the microphone converts the audio signal collected into the electrical signal, the audio circuit receives and converts the electrical signal into audio data, and transmits the audio data to the processor. After processed by the processor, the audio data is sent to, for example, another mobile phone via the RF circuit, or output to the memory for further processing.

Wi-Fi is a short distance wireless transmission technology, and the mobile phone can help the user send and receive e-mails, browse websites and access streaming media through the Wi-Fi module which provides the user with wireless broadband access to the Internet.

The processor is a control center of the mobile phone, is connected to various parts of the mobile phone by means a variety of interfaces and lines, and performs various functions of the mobile phone and data processing by running or executing software programs and/or modules stored in the memory and by invoking the data stored in the memory, so as to monitor the mobile phone overall. In at least one embodiment, the processor can include one or more processing units; preferably, the processor can be integrated with an application processor and a modem processor, in which the application processor mainly handles the operating system, the user interface and the application program, while the modem processor mainly deals with wireless communication.

It should be understood that the modem processor may not be integrated into the processor.

Moreover, the processor can act as an implementing element of the processing unit, to perform the same or similar function as the processing unit.

The mobile phone further includes a power source (like the battery 220) for supplying power to various components.

Preferably, the power source can be logically connected to the processor through a power management system, so as to achieve the management of charging, discharging, and power consumption and other functions by means of the power management system. Although not illustrated, the mobile phone can further include a Bluetooth module or the like, which will not be elaborated herein.

It should be noted that the mobile phone is only an example of the terminal 200 and is not constructed to limit the present disclosure. The present disclosure can be applied to an electronic device such as a mobile phone, a tablet computer and so on, and the present disclosure is not limited thereto.

Reference throughout this specification to "an embodiment," "some embodiments," "an exemplary embodiment," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been illustrated and described, it would be appreciated by those skilled in the art that changes, modifications, alternatives and variants can be made in the embodiments without departing from principles and purposes of the present disclosure. The protection scope of the present disclosure is defined by the claims or the like.

What is claimed is:

1. A housing assembly for an electronic device, comprising: a first housing; a second housing, the second housing and the first housing corporately defining a receptacle capable of receiving a battery; and two reinforcing features having a circular cross section, spaced apart from each other, each of the two reinforcing features having at least a part embedded in at least one of the first housing and the second housing by an injection molded part adjacent to a length or a width side of the battery, and axes of the two reinforcing features being flush with a central axis of the battery.

2. The housing assembly according to claim 1, wherein the two reinforcing features extend along a length direction or a width direction of the receptacle.

3. The housing assembly according to claim 1, wherein the first housing or the second housing is an aluminum-magnesium alloy piece or an aluminum alloy piece.

4. The housing assembly according to claim 1, wherein the two reinforcing features are stainless steel pieces.

5. The housing assembly according to claim 1, wherein hardness of the two reinforcing features is greater than hardness of the first housing or the second housing.

6. The housing assembly according to claim 1, wherein each of the two reinforcing features is a reinforcing column.

7. The housing assembly according to claim 6, wherein one of the reinforcing columns is close to a first end of the receptacle, and the other one of the reinforcing columns is close to a second end of the receptacle.

8. A housing assembly for an electronic device, comprising: a first housing; a second housing, the second housing and the first housing corporately defining a receptacle capable of receiving a battery; and two independent reinforcing features having a circular cross section, spaced apart from each other and located in the receptacle and at two side edges of the first housing, each of the two independent reinforcing features having at least a part embedded in the second housing by an injection molded part adjacent to a length or a width side of the battery, and central axes of the two independent reinforcing features and a central axis of the battery being in the same plane.

9. The housing assembly according to claim 8, wherein the first housing or the second housing is an aluminum-magnesium alloy piece or an aluminum alloy piece.

10. The housing assembly according to claim 8, wherein the two reinforcing features are stainless steel pieces.

11. The housing assembly according to claim 8, wherein hardness of the two reinforcing features is greater than hardness of the first housing or the second housing.

12. A housing assembly for an electronic device, comprising: a one-piece first housing; a second housing, the second housing and the one-piece first housing corporately defining a receptacle capable of receiving a battery; and two reinforcing features having a circular cross section, spaced apart from each other, each of the two reinforcing features having at least a part embedded in the second housing by an injection molded part adjacent to a length or a width side of the battery, and central axes of the two reinforcing features and a central axis of the battery being in the same plane.

13. The housing assembly according to claim 12, wherein the first housing or the second housing is an aluminum-magnesium alloy piece or an aluminum alloy piece.

14. The housing assembly according to claim 12, wherein the two reinforcing features are stainless steel pieces.

* * * * *